(12) United States Patent
Lee et al.

(10) Patent No.: US 7,476,625 B2
(45) Date of Patent: Jan. 13, 2009

(54) METHOD FOR FABRICATING SEMICONDUCTOR DEVICE

(75) Inventors: Sung-Kwon Lee, Kyoungki-do (KR);
Dong-Duk Lee, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 469 days.

(21) Appl. No.: 11/241,098

(22) Filed: Sep. 29, 2005

(65) Prior Publication Data

US 2006/0094250 A1    May 4, 2006

(30) Foreign Application Priority Data

Sep. 30, 2004  (KR) ........................... 2004-0077961

(51) Int. Cl.
*H01L 21/31* (2006.01)
*H01L 21/469* (2006.01)
(52) U.S. Cl. ............................... 438/758; 257/E21.507
(58) Field of Classification Search ................. 438/758; 257/E21, E21.507
See application file for complete search history.

(56) References Cited

U.S. PATENT DOCUMENTS

| | | | | |
|---|---|---|---|---|
| 5,904,521 A * | 5/1999 | Jeng et al. | ..................... | 438/253 |
| 6,174,767 B1 * | 1/2001 | Chi | ............................. | 438/253 |
| 6,281,073 B1 * | 8/2001 | Lee | ............................. | 438/255 |
| 6,649,510 B2 * | 11/2003 | Lee | ............................. | 438/618 |
| 2002/0163080 A1 * | 11/2002 | Taniguchi et al. | ........... | 257/758 |
| 2003/0235948 A1 * | 12/2003 | Park | ............................. | 438/253 |
| 2004/0082168 A1 * | 4/2004 | Lee et al. | ..................... | 438/683 |
| 2004/0127024 A1 * | 7/2004 | Lee | ............................. | 438/672 |
| 2005/0046048 A1 * | 3/2005 | Yun et al. | ................... | 257/900 |

FOREIGN PATENT DOCUMENTS

| | | |
|---|---|---|
| KR | 1997-0018582 | 4/1997 |
| KR | 2000-0003872 | 1/2000 |
| KR | 2002-0084935 | 11/2002 |
| KR | 10-2004-0002287 | 1/2004 |

\* cited by examiner

*Primary Examiner*—Marcos D. Pizarro
*Assistant Examiner*—Igwe U. Anya
(74) *Attorney, Agent, or Firm*—Blakely, Sokoloff, Taylor & Zafman LLP

(57) ABSTRACT

Disclosed is a method for fabricating a semiconductor device. The method includes: forming a first inter-layer insulation layer on a substrate provided with a plurality of cell contact plugs; selectively etching the first inter-layer insulation layer to form a plurality of first contact holes; performing a cleaning process to remove etch residues on lower portions of the first contact holes; forming insulating fences on inner walls of the first contact holes; forming a plurality of bit lines in contact with a group of the cell contact plugs through the respective first contact holes; forming a second inter-layer insulation layer over the plurality of bit lines; planarizing the second inter-layer insulation layer until an upper portion of each of the bit lines is exposed; and selectively etching the second inter-layer insulation layer in alignment with the bit lines, thereby obtaining a plurality of second contact holes.

23 Claims, 7 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device with contact holes.

DESCRIPTION OF RELATED ARTS

In general, a semiconductor device includes a plurality of unit devices inside of the semiconductor device. A trend in a large-scale of integration has brought a need to form semiconductor devices densely within a confined cell region. Thus, the sizes of unit devices of a semiconductor device, for instance, transistors and capacitors, have been gradually decreased. Particularly, in a dynamic random access memory (DRAM) device, the sizes of the unit devices formed within a cell region have been decreased as the design rule has been shifted towards minimization. For instance, DRAM devices are currently formed to have a minimum line width less than 0.1 µm and are often required to have a line width less than 80 nm. Hence, there exist many difficulties in applying conventional fabrication methods.

In case of applying a photolithography process using ArF having a wavelength of 193 nm to a semiconductor device having a line width less than 80 nm, it is necessary to develop an additional recipe for preventing an incidence of photoresist deformation created during an etching process employed for the purposes of forming a fine pattern and a vertical etch profile.

Meanwhile, advancement in an integration level of a semiconductor device has led device elements to be formed in stacks. A contact plug or a contact pad is one example of such stack structure.

For the contact plug, a landing plug contact (LPC) is commonly used since the LPC has a bottom portion which makes a wide contact within a minimum area and a top portion which is wider than the bottom portion for increasing a contact margin with respect to a subsequent process.

Furthermore, for forming such a LPC, it is difficult to etch inter-structures having a high aspect ratio. At this time, a self-aligned contact (SAC) etching process providing an etch profile based on different selectivity ratios of two materials, e.g., an oxide layer and a nitride layer, is introduced.

FIG. 1 is a top view illustrating a conventional semiconductor device provided with a plurality of contact holes for storage nodes.

Referring to FIG. 1, a plurality of line shaped gate structures G1 to G6 extending in a direction of Y are placed by a fixed spacing distance 'D' apart. A pitch of the semiconductor device can be obtained by a width 'W' of each of the gate structures G1 to G6 and the spacing distance 'D' and thus, a typical pitch of the semiconductor device is approximately (W+D)/2. A plurality of inter-layer insulation layers ILD patterned by a mask pattern for forming an I-type cell contact plug are placed over the plurality of gate structures G1 to G6. A plurality of cell contact plugs P, contacted with a substrate portion between the plurality of gate structures G1 to G6 and planarized with upper portions of the plurality of gate structures G1 to G6, are formed. A plurality of bit line contact plugs BLC overlapped with some of the plurality of cell contact plugs P are placed between the plurality of gate structures G1 to G6. A plurality of line-type bit lines B/L1 to B/L4 extending in a direction of X crossing the plurality of gate structures G1 to G6 are connected to the plurality of bit line contact plugs BLC. A plurality of storage node contact holes SNC exposing the plurality of cell contact plugs P that will be contacted with the storage nodes are formed to align with the plurality of bit lines B/L1 to B/L4.

Herein, the plurality of cell contact plugs P placed under the plurality of bit line contact plugs BLC are omitted and the plurality of storage node contact holes SNC are formed by using a hole type mask.

FIGS. 2A to 2D are cross-sectional views illustrating a conventional process for forming a plurality of storage node contact plugs. With reference to FIGS. 2A to 2D, the conventional process for forming the plurality of storage node contact plugs will be examined.

Meanwhile, FIGS. 2A to 2D are cross-sectional views taken along a line A-A' of FIG. 1.

As shown in FIG. 2A, an oxide-based first inter-layer insulation layer 201 is formed on a substrate 200 provided with various device elements such as wells and transistors. Herein, gate electrode patterns are not shown.

Subsequently, the first inter-layer insulation layer 201 is selectively etched, thereby forming a plurality of contact holes exposing impurity diffusion regions (not shown) of the substrate 200. At this time, a SAC etching process is employed.

Next, a conductive layer such as a polysilicon layer is deposited to fill the plurality of contact holes and then, a planarization process to expose a plurality of gate hard masks is performed, thereby forming a plurality of isolated cell contact plugs 202.

Subsequently, a second inter-layer insulation layer 203 is formed over the plurality of cell contact plugs 202. The second inter-layer insulation layer 203 is made of an oxide-based material practically used for forming the first inter-layer insulation layer 201.

Subsequently, a mask pattern 204 is formed and then, the second inter-layer insulation layer 203 is etched by using the mask pattern 204 as an etch mask, thereby forming a plurality of contact holes 205 exposing a group of the cell contact plugs 202. The contact holes 205 define regions where bit lines B/L will be formed. Afterwards, the mask pattern 204 is removed.

Subsequently, a cleaning process is performed to remove etch residues generated during forming the plurality of contact holes 205.

During performing the cleaning process, a solution of hydrogen fluoride (HF) or buffered oxide etchant is used. The etch residues that are not removed causes an increase of a contact resistance and thus, the cleaning process should be performed until the etch residues are removed. In the course of performing the cleaning process, a critical dimension (CD) of an upper portion of the individual contact hole 205 is increased as denoted with a reference numeral 206 in FIG. 2B. Herein, the contact holes 205 are bit line contact holes.

Subsequently, as shown in FIG. 2C, a barrier layer 207 is deposited over the plurality of contact holes 205. Then, a bit line conductive layer 208 such as a tungsten layer and an insulation layer 209 for forming a hard mask are deposited on the barrier layer 207. Afterwards, a selective etching process using a mask pattern for a bit line B/L is employed, thereby forming a plurality of bit lines B/L.

An insulation layer for a spacer is deposited over the bit lines B/L and afterwards, a blanket etch-back process is performed, thereby forming a plurality of spacers 210 on each sidewall of the plurality of bit lines B/L.

Next, as shown in FIG. 2D, an oxide-based third inter-layer insulation layer 211 is formed on an entire structure including the above described device elements. The third inter-layer insulation layer 211 is also made of the similar material used for forming the first and the second inter-layer insulation layers 201 and 203.

Subsequently, a chemical mechanical polishing (CMP) process or a partial etch back process is employed to remove and planarize an upper portion of the third inter-layer insulation layer 211.

A mask pattern 212 for forming a storage node contact plug is formed on the planarized third inter-layer insulation layer 211. Herein, the mask pattern 212 may be a typical photoresist pattern. Also, the mask pattern 212 may include a photoresist pattern and a sacrificial hard mask, or only a sacrificial hard mask.

A SAC etching process is performed to etch the third inter-layer insulation layer 211 and the second inter-layer insulation layer 203 by using the mask pattern 212 as an etch mask. The SAC etching process provides a plurality of storage node contact holes 213 aligned with lateral surfaces of the bit lines B/L and exposing another group of cell contact plugs 202. Subsequently, a wet cleaning process is performed, thereby removing etch residues.

Meanwhile, in the course of performing the SAC etching process as shown in FIG. 2D, as an etch target thickness is increased and a contact size is decreased, an alignment-margin of the mask pattern 212 is decreased, thereby generating a mis-alignment as denoted with a reference numeral 214. In this case, as indicated by a reference numeral 215, the bit line hard mask 209 is severely damaged during the SAC etching process and thus, a SAC fail exposing the bit line conductive layer 208 is generated.

Furthermore, during forming the contact holes 205, i.e., the bit line contact holes, a process margin is decreased in an area where a storage node contact will be formed due to the increased CD of the contact holes 205. (Refer to FIG. 2B) Accordingly, the barrier layer 207 disposed beneath the individual bit line B/L may also be exposed as denoted by a reference numeral 216, thereby generating an electric short between the individual storage node contact hole and the individual bit line B/L through a subsequent process.

Also, since the CD of a lower portion of a contact is more likely to decrease due to an increase in the thickness of a SAC target. Accordingly, in case of excessively performing a cleaning process to enlarge the CD, there may be a possibility that a seam is generated due to a damage on the cell contact plug 202.

SUMMARY OF THE INVENTION

It is, therefore, an object of the present invention to provide a method for fabricating a semiconductor device capable of preventing an electric short between a plurality of bit line contacts during forming storage node contact holes and a degradation in an insulation property.

In accordance with one aspect of the present invention, there is provided a semiconductor device, including: forming a first inter-layer insulation layer on a substrate provided with a plurality of cell contact plugs; selectively etching the first inter-layer insulation layer to form a plurality of first contact holes; performing a cleaning process to remove etch residues on lower portions of the first contact holes; forming insulating fences on inner walls of the first contact holes; forming a plurality of bit lines in contact with a group of the cell contact plugs through the respective first contact holes; forming a second inter-layer insulation layer over the plurality of bit lines; planarizing the second inter-layer insulation layer until an upper portion of each of the bit lines is exposed; and selectively etching the second inter-layer insulation layer in alignment with the bit lines, thereby obtaining a plurality of second contact holes exposing another group of the cell contact plugs supposed to be contacted with storage nodes.

In accordance with another aspect of the present invention, there is provided a method for fabricating a semiconductor device, including: forming a first inter-layer insulation layer on a substrate provided with a plurality of cell contact plugs; selectively etching the first inter-layer insulation layer to form a plurality of first contact holes; performing a cleaning process to remove etch residues on lower portions of the first contact holes; forming insulating fences on inner walls of the first contact holes; forming a plurality of bit lines in contact with a group of the cell contact plugs through the respective first contact holes; forming a second inter-layer insulation layer over the plurality of bit lines; performing a planarization process on the second inter-layer insulation layer until the second inter-layer insulation layer remains on the plurality of bit lines; and selectively etching the second inter-layer insulation layer, thereby obtaining a plurality of second contact holes exposing another group of the cell contact plugs in contact with storage nodes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

FIGS. 3A to 3E are cross-sectional views illustrating a process for forming a plurality of contact holes for forming a storage node in accordance with an embodiment of the present invention.

Figure 1:
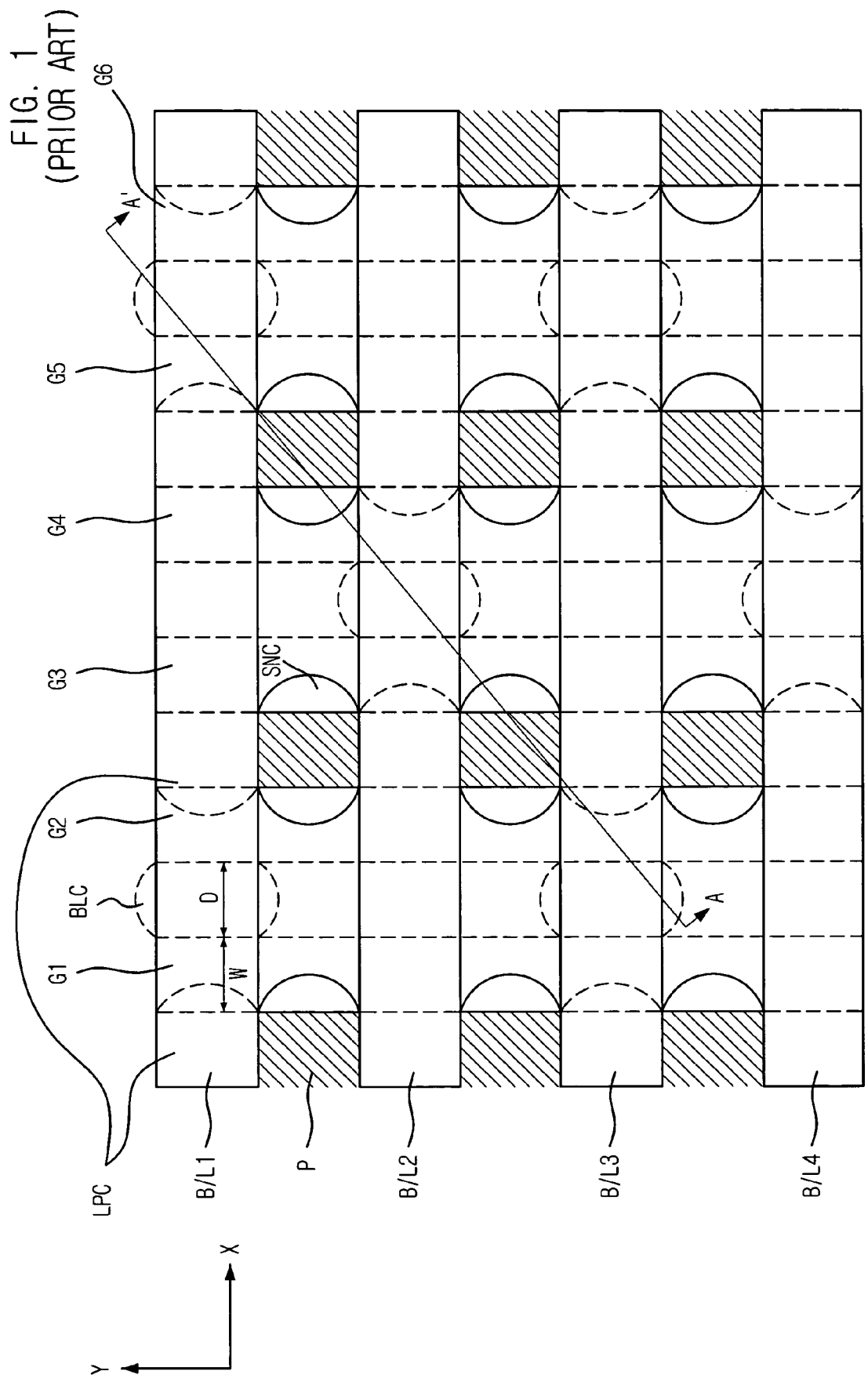
FIG. 1 is a top-view illustrating a conventional semiconductor device provided with storage node contact holes.
Figure 2A:
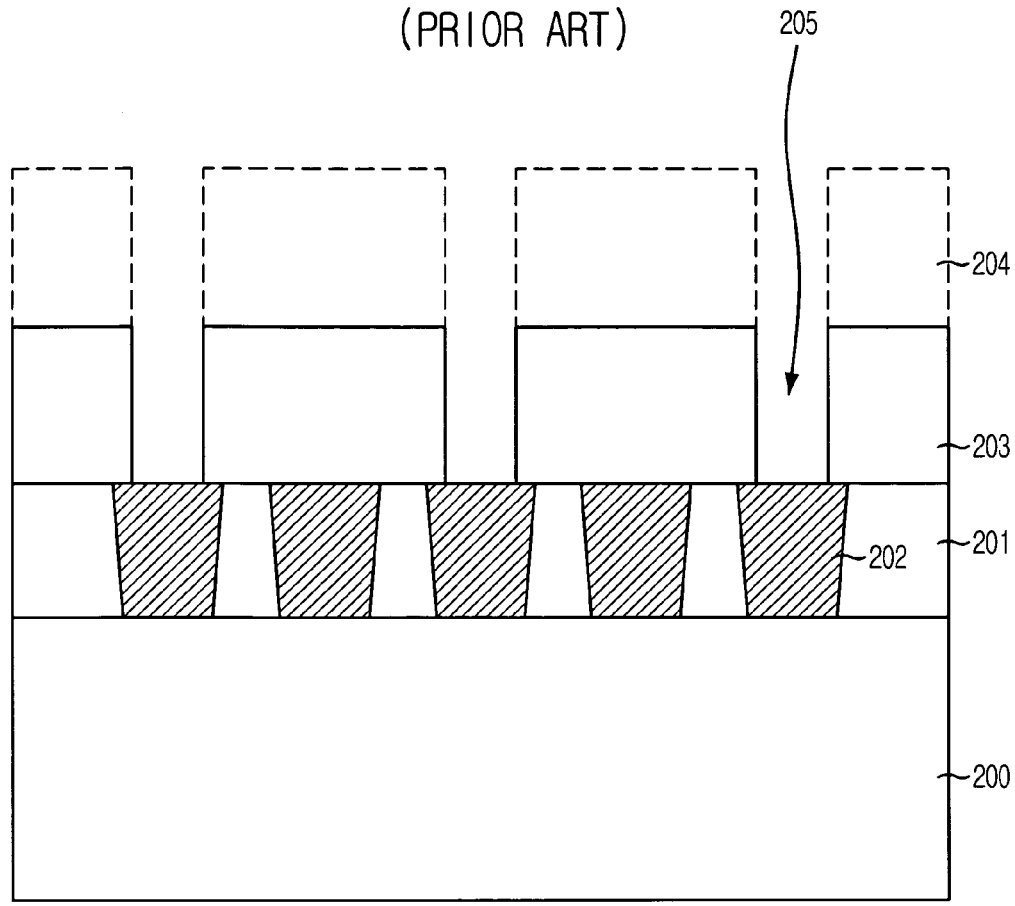
FIGS. 2A to 2D are cross-sectional views illustrating a conventional storage node contact hole fabrication method.
Figure 2B:
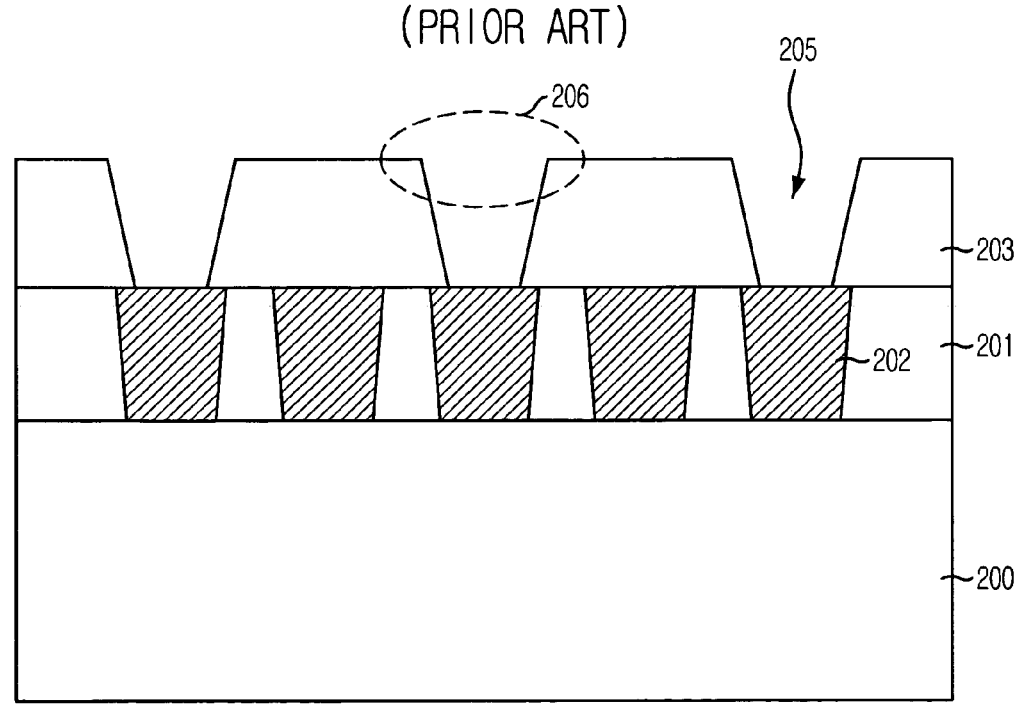
Figure 2C:
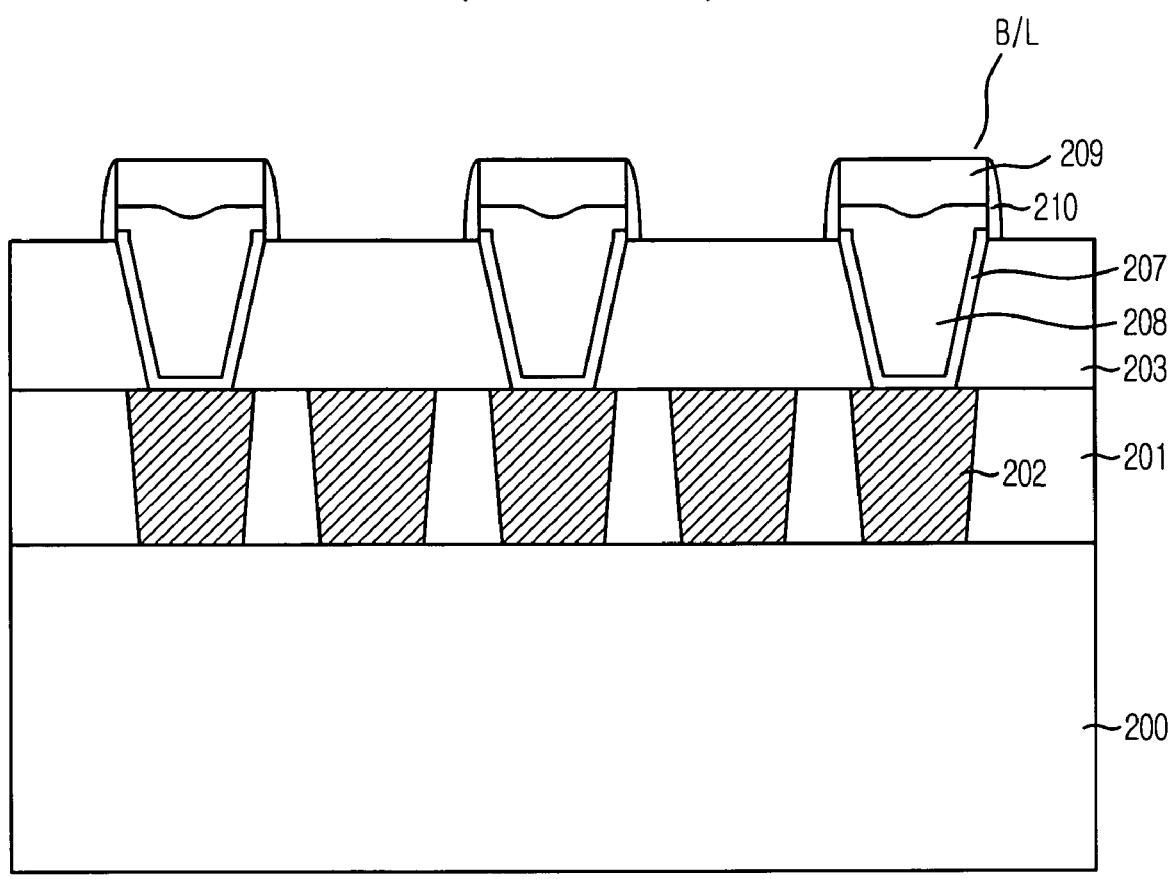
Figure 2D:
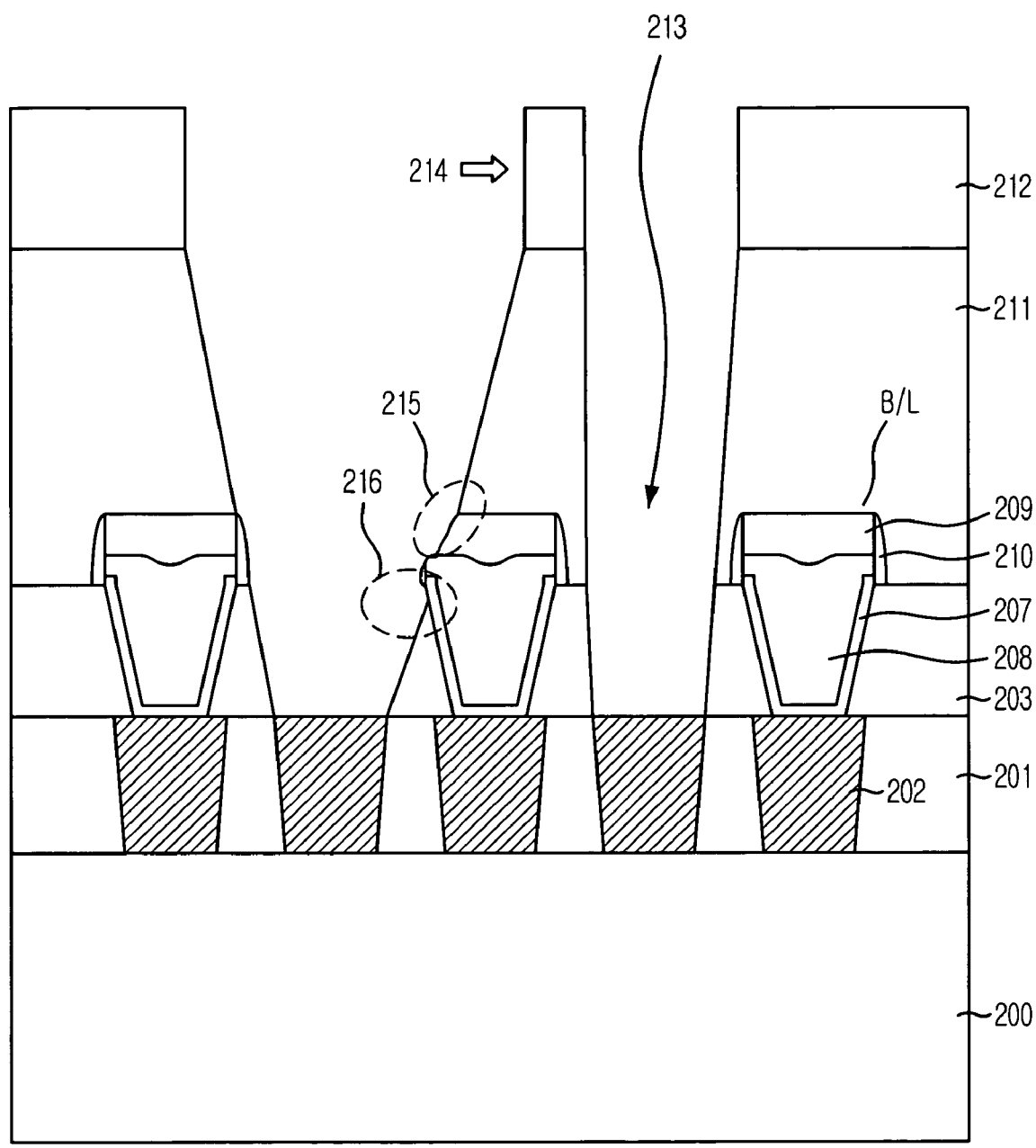

FIGS. 3A to 3E are cross-sectional views of a semiconductor device viewed in the same direction of the line A-A' of FIG. 1.

Figure 3A:
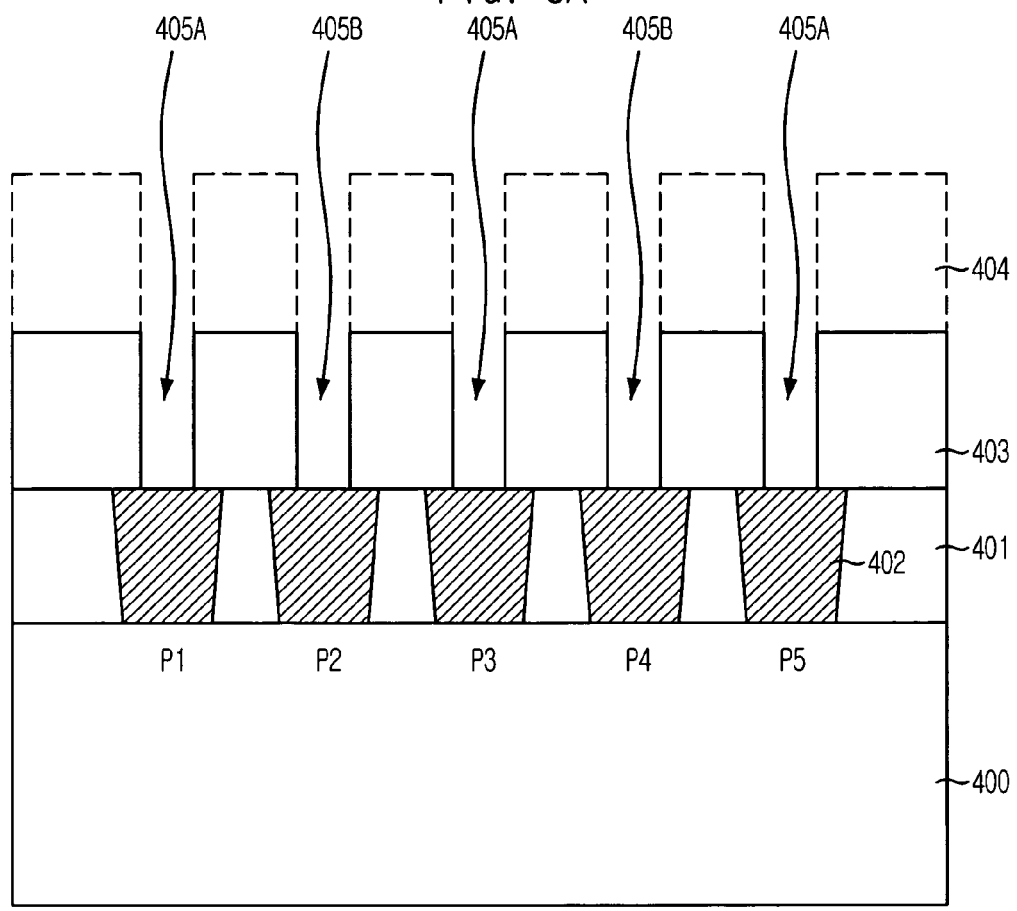
FIGS. 3A to 3E are cross-sectional views illustrating a method for forming a contact hole for a storage node in accordance with an embodiment of the present invention.

As shown in FIG. 3A, a first inter-layer insulation layer 401 is formed on a substrate 400 provided with various device elements such as wells and transistors.

In case of using an oxide-based layer to form the first inter-layer insulation layer 401, a layer selected from a group consisting of a borosilicate glass (BSG) layer, a borophosphosilicate glass (BPSG) layer, a phosphosilicate glass (PSG) layer, a tetraethylorthosilicate (TEOS) layer, a high density plasma (HDP) oxide layer, a spin-on-glass (SOG) layer and an advanced planarization layer (APL) is used. In addition to the aforementioned layer, an inorganic or organic based low k-dielectric layer can be used.

For a reference, gate structure patterns are omitted herein.

Subsequently, the first inter-layer insulation layer 401 is selectively etched, thereby forming contact holes (not shown) exposing impurity diffusion regions of the substrate 400. At this time, a self-align contact (SAC) etching process is employed.

A conductive layer such as polysilicon is deposited to fill the contact holes and afterwards, a planarization process is performed until each gate hard mask is exposed, thereby forming a plurality of isolated cell contact plugs 402. Herein, the cell contact plugs are individually numbered from P1 to P5.

Subsequently, a second inter-layer insulation layer 403 is formed on an entire surface where the plurality of cell contact plugs 402 are formed. The second inter-layer insulation layer 403 uses an oxide-based layer or a low k-dielectric layer that is practically similar with the material used for forming the first inter-layer insulation layer 401.

Subsequently, a first mask pattern 404 is formed and then, the second inter-layer insulation layer 403 is etched by using the first mask pattern 404 as an etch mask. Afterwards, a plurality of contact holes 405A exposing a predetermined portion of the individual cell contact plug 402 are formed, thereby defining regions where a plurality of bit lines B/L are formed. Meanwhile, in accordance with the present invention, during forming the plurality of contact holes 405A defining the regions where the bit lines B/L are formed, a plurality of contact holes 405B are also formed in regions where storage nodes are formed. The first mask pattern 404 is removed.

Figure 3B:
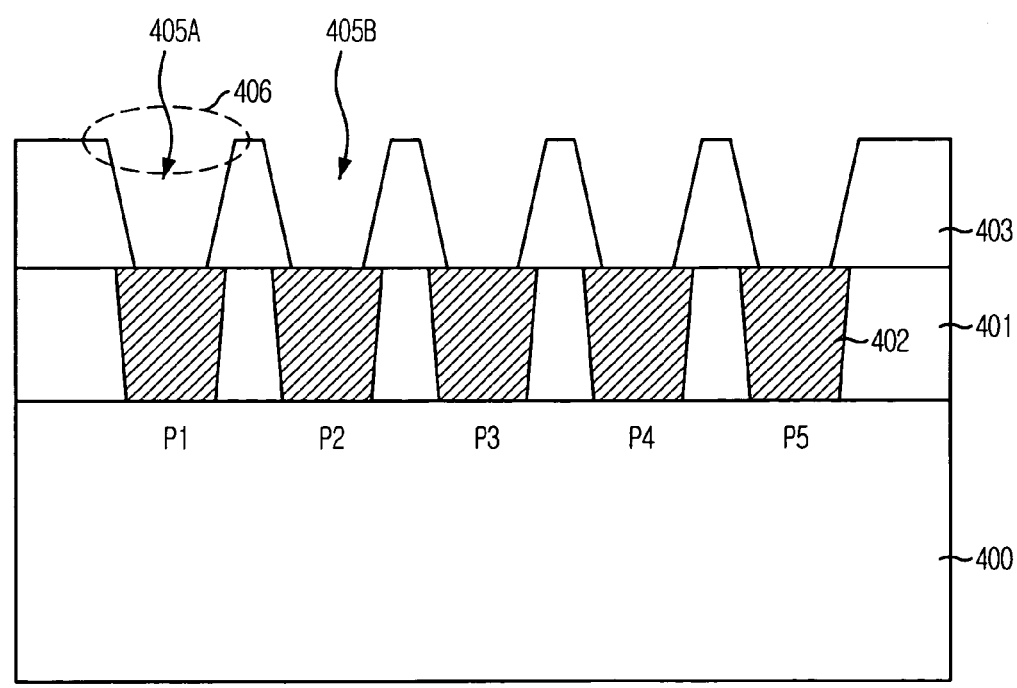

As shown in FIG. 3B, a cleaning process is performed to remove etch residues generated during forming the plurality of contact holes 405A and 405B.

During performing the cleaning process, a solution of hydrogen fluoride (HF) or buffered oxide etchant (BOE) is used. The etch residues that are not removed cause an increase of a contact resistance. Accordingly, the cleaning process is performed until the etch residues are removed. In the course of performing the cleaning process, a critical dimension (CD) of an upper portion of the individual contact hole 405A or 405B is increased as denoted with a reference numeral 406.

Figure 3C:
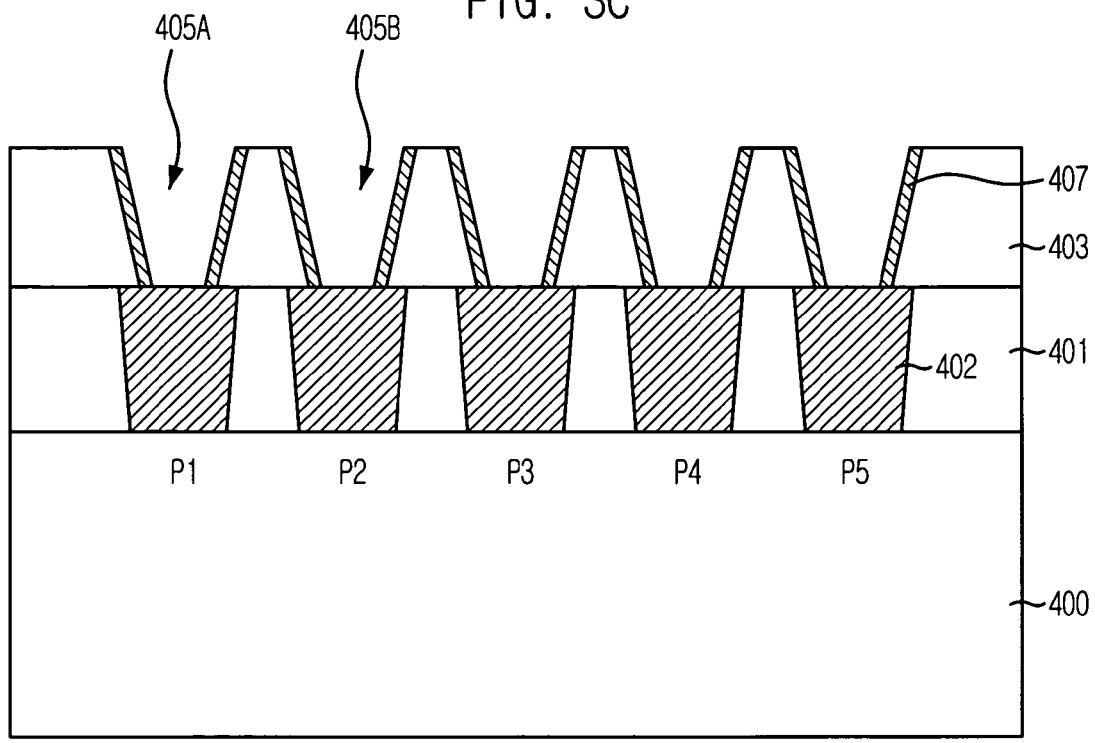

As shown in FIG. 3C, an insulation layer fo4 forming a fence is formed over the plurality of contact holes 405A and 405B. Afterwards, a blanket etch-back process is employed, thereby forming a plurality of insulating fences 407 on inner walls of the contact holes 405A and 405B.

The fences 407 serve a role in preventing an electric short between a storage node and a bit line contact due to a misalignment during forming a contact hole for a subsequent storage node or a degradation in an insulation property. The fences 407 have a spacer type and it is preferable to form the fences 407 only on inner walls of the contact holes 405A and 405B.

The insulation layer for forming the fences 407 uses a layer selected from a group consisting of a silicon oxynitride layer, a silicon nitride layer, a plasma enhanced (PE)-TEOS layer, a HDP oxide layer, and an oxide layer deposited through an atomic layer deposition method. It is preferable to deposit the insulation layer in a thickness ranging from approximately 10 Å to approximately 100 Å.

Figure 3D:
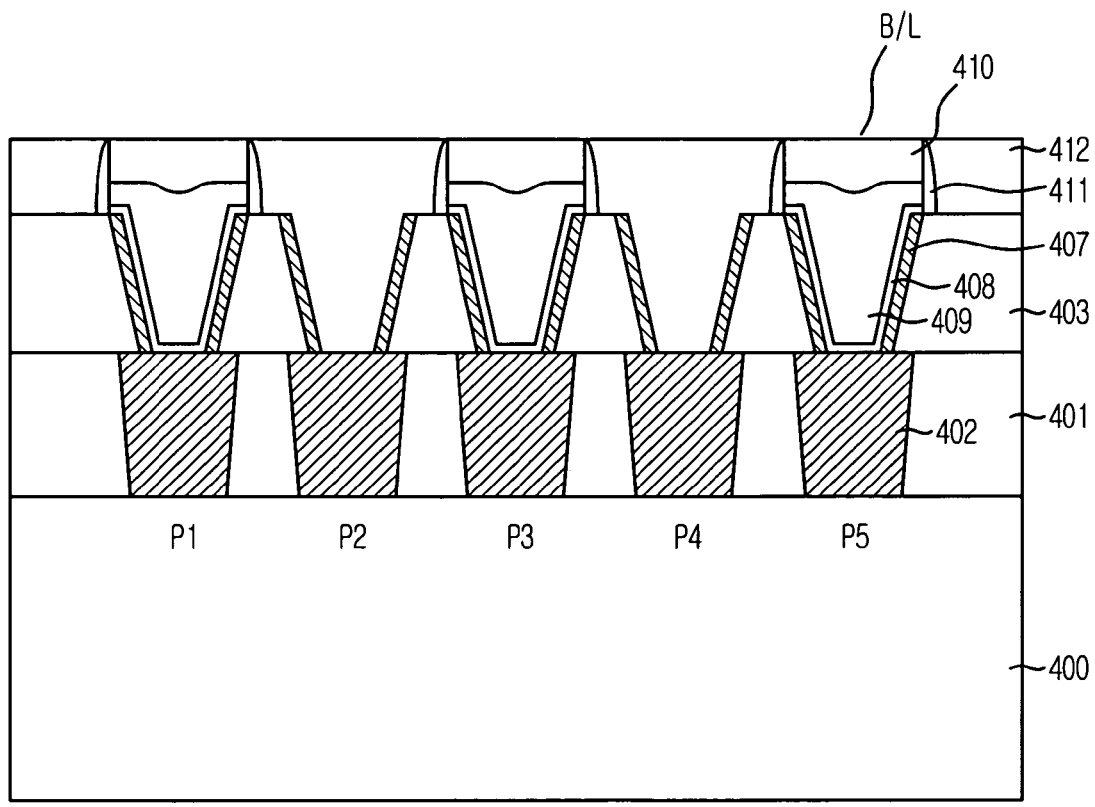

Subsequently, as shown in FIG. 3D, a barrier layer 408 is deposited along a profile of the fences 407 and then, a conductive layer 409 for forming a bit line B/L and an insulation layer 410 for a hard mask are deposited. Afterwards, a selective etching process is performed by using a mask pattern, thereby forming a plurality of bit lines B/L.

An insulation layer for a spacer is deposited over the bit lines B/L and then, a blanket etch-back process is performed, thereby forming a plurality of spacers 411 on sidewalls of the bit lines B/L. The insulation for the spacer is a nitride-based layer.

The conductive layer 409 uses a structure formed by a material selected singly or in combination from a group consisting of polysilicon, tungsten (W), tungsten nitride (WN), and tungsten silicide ($WSi_x$).

The insulation layer 410 for use in a hard mask serves a role in preventing the conductive layer 409 from being damaged during forming storage node contact holes by etching the third inter-layer insulation layer. The insulation layer 410 for use in a hard mask uses a material having a different etch rate from that of an inter-layer insulation layer. Hereinafter, the insulation layer 410 that is patterned through the above bit line formation process will be referred to as a hard mask.

For instance, in case of using an oxide layer for forming an inter-layer insulation layer, a nitride-based material such as a silicon nitride (SiN) layer or a silicon oxynitride (SiON) layer is used and, in the case of using a polymer-based low k-dielectric layer for forming an inter-layer insulation layer, an oxide-based material such as aluminum oxide ($Al_2O_3$) is used. The spacers 411 prevents a damage on the plurality of bit lines B/L during performing a subsequent etching process, e.g., a SAC etching process, on the plurality of bit lines B/L.

Next, an oxide-based third inter-layer insulation layer 412 is formed on an entire upper structure where the plurality of bit lines B/L are formed. The third inter-layer insulation layer 412 is also made of the similar material used for forming the first and the second inter-layer insulation layers 401 and 403.

Subsequently, during a planarization process employed to remove and planarize an upper portion of the third inter-layer insulation layer 412, it is targeted to expose the hard mask 410 to decrease an etch target thickness during a subsequent storage node contact hole formation process. The planarization process can be a chemical mechanical polishing (CMP) process or an etch back process.

Meanwhile, predetermined portions of the third inter-layer insulation layer 412 can remain on the hard mask 410. At this time, it is preferable to remain the predetermined portions of the third inter-layer insulation layer 412 in a thickness equal to or less than approximately 500 Å.

Figure 3E:
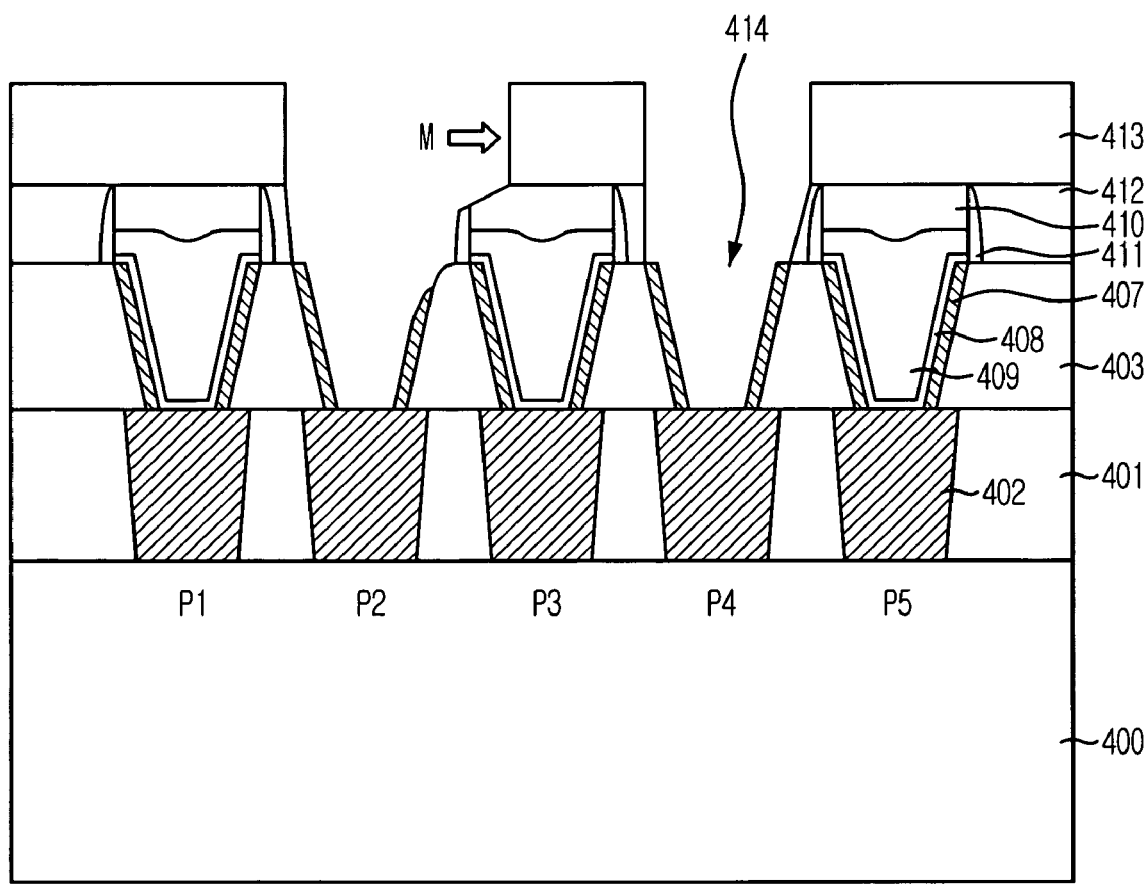

Subsequently, as shown in FIG. 3E, a second mask pattern 413 for forming a storage node contact plug is formed on the planarized third inter-layer insulation layer 412 and the exposed hard mask 410.

Herein, the second mask pattern 413 can be a typical photoresist pattern. Also, the second mask pattern 413 can include a photoresist pattern and a sacrificial hard mask, or only a sacrificial hard mask.

The sacrificial hard mask is used for securing etch tolerance of the photoresist layer due to a limitation in resolution of a photolithography process and preventing an incidence of pattern deformation. A tungsten layer, a polysilicon layer, an amorphous carbon layer or a nitride layer is mainly used to form the sacrificial hard mask.

Meanwhile, during forming the photoresist pattern, an anti-reflective coating layer can be used between the photoresist pattern and a layer beneath the photoresist pattern. The anti-reflective coating layer is used for the purpose of preventing an undesirable pattern from being formed by scattered reflection since a degree of light reflection is high during performing a photo-exposure process for forming a pattern, and improving adhesiveness between the photoresist pattern and the layer beneath the photoresist pattern.

At this time, the anti-reflective coating layer mainly uses an organic based material having a similar property with the photoresist pattern. However, the anti-reflective coating layer can be omitted.

More specific to the process for forming the photoresist pattern, a photoresist for ArF or $F_2$ light source, e.g., cycloolefin-maleic anhydride (COMA) or acrylate which is a photoresist material for ArF or $F_2$ light source, is coated on the lower structure of the anti-reflective coating layer or the sacrificial hard mask in a predetermined thickness by performing a spin coating method. Afterwards, predetermined portions of the photoresist are selectively photo-exposed by employing a photolithography device using ArF or $F_2$ light source and a predecided reticle (not shown) for defining a width of a contact hole. Thereafter, a developing process makes a photo-exposed portion or a non-photo-exposed portion remain, and a post-cleaning process is then performed to remove etch remnants, thereby forming the photoresist pattern which opens cell contact regions.

Herein, the photoresist pattern and the second mask pattern 413 expose the third inter-layer insulation layer 412 overlapped with a group of the plurality of hole-type cell contact plugs 402 which are placed in every other region between the plurality of bit lines B/L.

Subsequently, a SAC etching process etches the third inter-layer insulation layer 412 by using the second mask pattern 413 as an etch mask, thereby forming a plurality of storage node contact holes 414 aligned with lateral sides of the plurality of bit lines B/L and exposing the group of the cell contact plugs 402.

At this time, a typical recipe for the SAC etching process is employed. That is, a fluorine-based plasma, e.g., a $C_xF_y$ gas where x and y range from approximately 1 to approximately 10 such as $C_2F_4$, $C_2F_6$, $C_3F_8$, $C_4F_6$, $C_5F_8$ or $C_5F_{10}$, is used as a main gas along with an additional $C_aH_bF_c$ gas where a, b and c range from approximately 1 to approximately 10 such as $CH_2F_2$, $C_3HF_5$ or $CHF_3$. At this time, an inert gas such as He, Ne Ar or Xe is used as a carrier gas.

Meanwhile, in case of using a material layer for forming a sacrificial hard mask, the material layer for the sacrificial hard mask is first etched by using a photoresist pattern as an etch mask, thereby forming a sacrificial hard mask defining regions where a plurality of storage node contact plugs will be formed. Afterwards, a SAC etching process etches the third inter-layer insulation layer 412 by using the sacrificial hard mask as an etch mask.

Next, the photoresist pattern is removed by employing a photoresist stripping process. In case of using the sacrificial hard mask, the photoresist pattern is removed either after a contact opening process or during a plug isolation process.

Next, in order to extend lower portions of the storage node contact holes 414, an additional process using BOE is performed. Meanwhile, in case of using a nitride-based etch stop layer on upper portions of the plurality of cell contact plugs 402 to prevent a damage on the plurality of cell contact plugs 402, the etch stop layer can be removed through an additional etching process.

Next, before a deposition of a conductive layer for forming the storage node contact plugs a cleaning process is performed to remove an interface oxide layer formed in lower portions of the plurality of storage node contact holes 414 and impurities. At this time, BOE is used.

Meanwhile, as described in FIG. 3E, as the etch target thickens is increased during the etching process and the contact size is decreased, an alignment-margin of the second mask pattern 413 is decreased. Thus, even though a mis-alignment as denoted with a reference denotation M is generated, the had mask 410 is not excessively damaged unlike the conventional method since the third inter-layer insulation layer is planarized, thereby decreasing the SAC etch target thickness. Accordingly, a SAC fail that the conductive layer 409 is exposed is not generated.

Furthermore, during forming the contact holes for forming the bit line B/L, since the insulating fences 407 are formed on the inner walls of the contact holes, even though the CDs of the contact holes increases and the mis-alignment is generated, the barrier layer 408 beneath the bit line B/L is not exposed. Accordingly, an electric short between the storage node contact plug and the bit line B/L is not generated due to a subsequent process.

Also, in accordance with the embodiment of the present invention, due to a decrease in the SAC etch target thickness the CD in the lower portion of the contact is decreased less than the CD formed by using the conventional method. Accordingly, the cleaning process doest not have to be performed excessively to extend the CD and thus, a seam is not generated due to a damage on the cell contact plugs 402.

Meanwhile, although not shown, a conductive layer for forming a storage node plug is deposited on an entire surface of the structure shown in FIG. 3E through a subsequent process, thereby filling the storage node contact holes 414. Afterwards, a plug planarization process is performed until the hard mask 410 is exposed, thereby forming storage node contact plugs.

Although the hole type mask pattern for forming a storage node contact hole is exemplified in the embodiment of the present invention, various types such as a line-type or a T-type can also be applied.

In accordance with the present invention, during forming a plurality of contact holes for storage nodes, it is possible to prevent a degradation in an insulating property with respect to a bit line, an electric short between the storage node and the bit line and a SAC fail, thereby providing an effect of improving yields of semiconductor devices.

The present application contains subject matter related to the Korean patent application No. KR 2004-0077961, filed in the Korean Patent Office on Sep. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first inter-layer insulation layer on a substrate provided with a plurality of cell contact plugs;
    selectively etching the first inter-layer insulation layer to form a plurality of first contact holes and a plurality of second contact holes;
    performing a cleaning process to remove etch residues on lower portions of the first contact holes and the second contact holes;
    forming insulating fences on inner walls of the first contact holes and the second contact holes;
    forming a plurality of bit lines in contact with a group of the cell contact plugs through the respective first contact holes;
    forming a second inter-layer insulation layer over the plurality of bit lines;
    planarizing the second inter-layer insulation layer until an upper portion of each of the bit lines is exposed; and
    selectively etching the second inter-layer insulation layer in alignment with the bit lines to expose another group of the cell contact plugs through the second contact holes, in which storage nodes are to be formed.

2. The method of claim 1, wherein the forming of the insulating fences further includes:

forming an insulation layer over the first plurality of contact holes; and forming the fences on inner walls of the first contact holes in a spacer type by employing a blanket etch-back process.

3. The method of claim 2, wherein the insulation layer for forming the fences has a thickness ranging form approximately 10 Å to approximately 100 Å.

4. The method of claim 2, wherein the insulation layer for forming the fences includes a material selected from a group consisting of a silicon oxynitride layer, a silicon nitride layer, a plasma enhanced (PE)-tetraethylorthosilicate (TEOS) layer, a TEOS layer, a high density plasma (HDP) oxide layer and an oxide layer obtained through an atomic layer deposition (ALD) method.

5. The method of claim 1, wherein the selective etching of the second inter-layer insulation layer utilizes a mask pattern.

6. The method of claim 5, wherein the mask pattern includes a structure selected from a group consisting of a photoresist pattern, a photoresist pattern/an organic based anti-reflective coating layer, a photoresist pattern/a sacrificial hard mask and a photoresist pattern/a sacrificial hard mask/an organic anti-reflective coating layer.

7. The method of claim 6, wherein the sacrificial hard mask includes one of a polysilicon layer, a tungsten layer and a nitride layer.

8. The method of claim 7, wherein the forming of the photoresist pattern proceeds with one of an ArF photolithography process and a $F_2$ photolithography process.

9. The method of claim 1, wherein the first inter-layer insulation layer and the second inter-layer insulation layer include an oxide layer.

10. The method of claim 9, wherein the forming of the plurality of first contact holes and the plurality of second contact holes use a self-aligned contact (SAC) etching process.

11. The method of claim 10, wherein the forming of the plurality of first contact holes and the plurality of second contact holes uses a gas of $C_xF_y$ where x and y range from approximately 1 to approximately 10 as a main gas, a gas of $C_aH_bF_c$ where a, b and c range from approximately 1 to approximately 10 to generate a polymer and an inert gas selected from a group consisting of He, Ne, Ar, and Xe as a carrier gas.

12. A method for fabricating a semiconductor device, comprising:
   forming a first inter-layer insulation layer on a substrate provided with a plurality of cell contact plugs;
   selectively etching the first inter-layer insulation layer to form a plurality of first contact holes and a plurality of second contact holes;
   performing a cleaning process to remove etch residues on lower portions of the first contact holes and the second contact holes;
   forming insulating fences on inner walls of the first contact holes; forming a plurality of bit lines in contact with a group of the cell contact plugs through the respective first contact holes;
   forming a second inter-layer insulation layer over the plurality of bit lines;
   performing a planarization process on the second inter-layer insulation layer until the second inter-layer insulation layer remains on the plurality of bit lines; and
   selectively etching the second inter-layer insulation layer to expose another group of the cell contact plugs through the second contact holes, in which with storage nodes are to be formed.

13. The method of claim 12, wherein the second inter-layer insulation layer remains in a thickness equal to or less than approximately 500 Å.

14. The method of claim 12, wherein the forming of the insulating fences further includes:
   forming an insulation layer for forming the fences over the first plurality of contact holes; and
   forming the fences on inner walls of the first contact holes in a spacer type by employing a blanket etch-back process.

15. The method of claim 14, wherein the insulation layer for forming the fences has a thickness ranging form approximately 10 Å to approximately 100 Å.

16. The method of claim 14, wherein the insulation layer for forming the fences includes a material selected from a group consisting of a silicon oxynitride layer, a silicon nitride layer, a plasma enhanced (PE)-tetraethylorthosilicate (TEOS) layer, a TEOS layer, a high density plasma (HDP) oxide layer and an oxide layer obtained through an atomic layer deposition (ALD) method.

17. The method of claim 12, wherein the selective etching of the second inter-layer insulation layer utilizes a mask pattern.

18. The method of claim 17, wherein the mask pattern includes a structure selected from a group consisting of a photoresist pattern, a photoresist pattern/an organic based anti-reflective coating layer, a photoresist pattern/a sacrificial hard mask and a photoresist pattern/a sacrificial hard mask/an organic anti-reflective coating layer.

19. The method of claim 18, wherein the sacrificial hard mask includes one of a polysilicon layer, a tungsten layer and a nitride layer.

20. The method of claim 19, wherein the forming of the photoresist pattern proceeds with one of an ArF photolithography process and a $F_2$ photolithography process.

21. The method of claim 12, wherein the first inter-layer insulation layer and the second inter-layer insulation layer include an oxide layer.

22. The method of claim 21, wherein the forming of the plurality of first contact holes and the plurality of second contact holes use a self-aligned contact (SAC) etching process.

23. The method of claim 22, wherein at the forming of the plurality of first contact holes and the plurality of second contact holes uses a gas of $C_xF_y$ where x and y range from approximately 1 to approximately 10 as a main gas, a gas of $C_aH_bF_c$ where a, b and c range from approximately 1 to approximately 10 to generate a polymer and an inert gas selected from a group consisting of He, Ne, Ar, and Xe as a carrier gas.

* * * * *